US011980068B2

(12) United States Patent
Liu et al.

(10) Patent No.: US 11,980,068 B2
(45) Date of Patent: May 7, 2024

(54) DISPLAY PANEL AND DISPLAY DEVICE WITH MULTIPLEXED PHOTOSENSITIVE AND DISPLAY REGION

(71) Applicant: Xiamen Tianma Micro-Electronics Co., Ltd., Xiamen (CN)

(72) Inventors: Bingping Liu, Xiamen (CN); Junyi Li, Xiamen (CN); Guozhao Chen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 82 days.

(21) Appl. No.: 17/172,850

(22) Filed: Feb. 10, 2021

(65) Prior Publication Data

US 2022/0173195 A1 Jun. 2, 2022

(30) Foreign Application Priority Data

Nov. 30, 2020 (CN) .......................... 202011375240.1

(51) Int. Cl.
*H10K 59/131* (2023.01)
*G02F 1/1362* (2006.01)
*H10K 59/35* (2023.01)
*H10K 59/65* (2023.01)

(52) U.S. Cl.
CPC ..... *H10K 59/131* (2023.02); *G02F 1/136286* (2013.01); *H10K 59/351* (2023.02); *H10K 59/352* (2023.02); *H10K 59/65* (2023.02)

(58) Field of Classification Search
CPC .................... G02F 1/133391; G02F 1/136286
See application file for complete search history.

(56) References Cited

U.S. PATENT DOCUMENTS

| 6,307,216 B1* | 10/2001 | Huh | ...................... G02F 1/1309 257/350 |
| 2018/0275457 A1* | 9/2018 | Chang | ................. H01L 27/3213 |
| 2019/0051670 A1* | 2/2019 | Bei | ....................... H01L 27/124 |

FOREIGN PATENT DOCUMENTS

| CN | 101699339 A | 4/2010 | |
| CN | 10-8761943 | * 6/2018 | ........... G02F 1/1362 |
| CN | 108847415 A | 11/2018 | |
| CN | 110767166 A | 2/2020 | |
| CN | 111554227 A | 8/2020 | |

* cited by examiner

*Primary Examiner* — Lauren Nguyen
(74) *Attorney, Agent, or Firm* — Anova Law Group, PLLC

(57) ABSTRACT

A display panel and a display device are provided in the present disclosure. The display panel includes a first display region and a second display region which are adjacently arranged. A light transmittance of the first display region is greater than a light transmittance of the second display region. The display panel further includes a plurality of scan lines and a plurality of data lines extending along the second direction. One first sub-pixel row is electrically connected to at least two of the plurality of scan lines. The plurality of data lines includes first data lines, where one of the first data lines is electrically connected to the first sub-pixel column, and at least a part of the first data lines is made of a transparent conductive material. In the first display region, at least two of the first data lines are connected through a connection line.

20 Claims, 10 Drawing Sheets

DISPLAY PANEL AND DISPLAY DEVICE WITH MULTIPLEXED PHOTOSENSITIVE AND DISPLAY REGION

CROSS-REFERENCE TO RELATED APPLICATION

This application claims the priority of Chinese Patent Application No. 202011375240.1, filed on Nov. 30, 2020, the content of which is incorporated herein by reference in its entirety.

TECHNICAL FIELD

The present disclosure generally relates to the field of display technology and, more particularly, relates to a display panel and a display device.

BACKGROUND

In the existing display devices, display panels are mainly divided into two mainstream categories including liquid crystal display panels and organic self-light-emitting display panels. Currently, high body-to-screen ratio requirement for mobile phones and other products has gradually increased, and the market penetration rate for the full screen is approximately 70%. The so-called screen-to-body ratio is a ratio of a screen area to an area of a whole device. A relatively high screen-to-body ratio can bring a better visual experience to users.

In order to meet the high body-to-screen ratio requirement of users, the display technology including "band screen" and "water drop screen" may be developed, where a hole may be formed in a display region, and a front camera may be disposed under the screen, but the region directly above the camera may not display normally. Following the "band screen" and display, more manufacturers have launched new structures for the "front camera" design, such as lift front camera, sliding full screen, side-sliding lift camera, and digging hole full screen. The designs including lift front camera, side-sliding lift camera, and sliding full screen may better solve the contradiction between the front camera and the body-to-screen ratio; however, the "water drop screen", in order to further increase the body-to-screen ratio of the liquid crystal complexity of internal structures may be increased, and the manufacturing cost may also be increased; meanwhile, certain space in the whole device may be occupied by the structures, which may affect the battery layout, the volume and weight of the whole device.

The digging hole full screen may better solve the contradiction between the front camera and the body-to-screen ratio while keeping the original body structure unchanged. However, the overall visual experience of the screen may be affected due to the digging hole existence. With the display technology improvement, the display devices are developed toward a super-large screen-to-body ratio (i.e., the ratio of the display region to the entire front of the display device) direction, and even a full screen direction. How to increase the screen-to-body ratio of the display device while ensuring the camera photographing effect and the display effect of the digging region has become a research hotspot for those skilled in the art.

Therefore, there is a need to provide a display panel and a display device which can increase the screen-to-body ratio and implement the full screen display without affecting the camera photographing effect and the display effect of the digging region.

SUMMARY

One aspect of the present disclosure provides a display panel. The display panel includes a first display region and a second display region which are adjacently arranged. A light transmittance of the first display region is greater than a light transmittance of the second display region; the first display region includes a plurality of first pixels arranged in an array; a first pixel of the plurality of first pixels includes a first region and a second region; the first region includes a plurality of first sub-pixels with different colors; and a light transmittance of the second region is greater than a light transmittance of the first region; and first sub-pixels arranged along a first direction form a first sub-pixel row, and first sub-pixels arranged along a second direction form a first sub-pixel column, where the first direction intersects the second direction. The display panel further includes a plurality of scan lines and a plurality of data lines extending along the second direction. One first sub-pixel row is electrically connected to at least two of the plurality of scan lines; the plurality of data lines includes first data lines, where one of the first data lines is electrically connected to the first sub-pixel column, and at least a part of a first data line is made of a transparent conductive material; and in the first display region, at least two of the first data lines are connected with each other through a connection line.

Another aspect of the present disclosure provides a display device including a display panel. The display panel includes a first display region and a second display region which are adjacently arranged. A light transmittance of the first display region is greater than a light transmittance of the second display region; the first display region includes a plurality of first pixels arranged in an array; a first pixel of the plurality of first pixels includes a first region and a second region; the first region includes a plurality of first sub-pixels with different colors; and a light transmittance of the second region is greater than a light transmittance of the first region; and first sub-pixels arranged along a first direction form a first sub-pixel row, and first sub-pixels arranged along a second direction form a first sub-pixel column, where the first direction intersects the second direction. The display panel further includes a plurality of scan lines and a plurality of data lines extending along the second direction. One first sub-pixel row is electrically connected to at least two of the plurality of scan lines; the plurality of data lines includes first data lines, where one of the first data lines is electrically connected to the first sub-pixel column, and at least a part of a first data line is made of a transparent conductive material; and in the first display region, at least two of the first data lines are connected with each other through a connection line.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
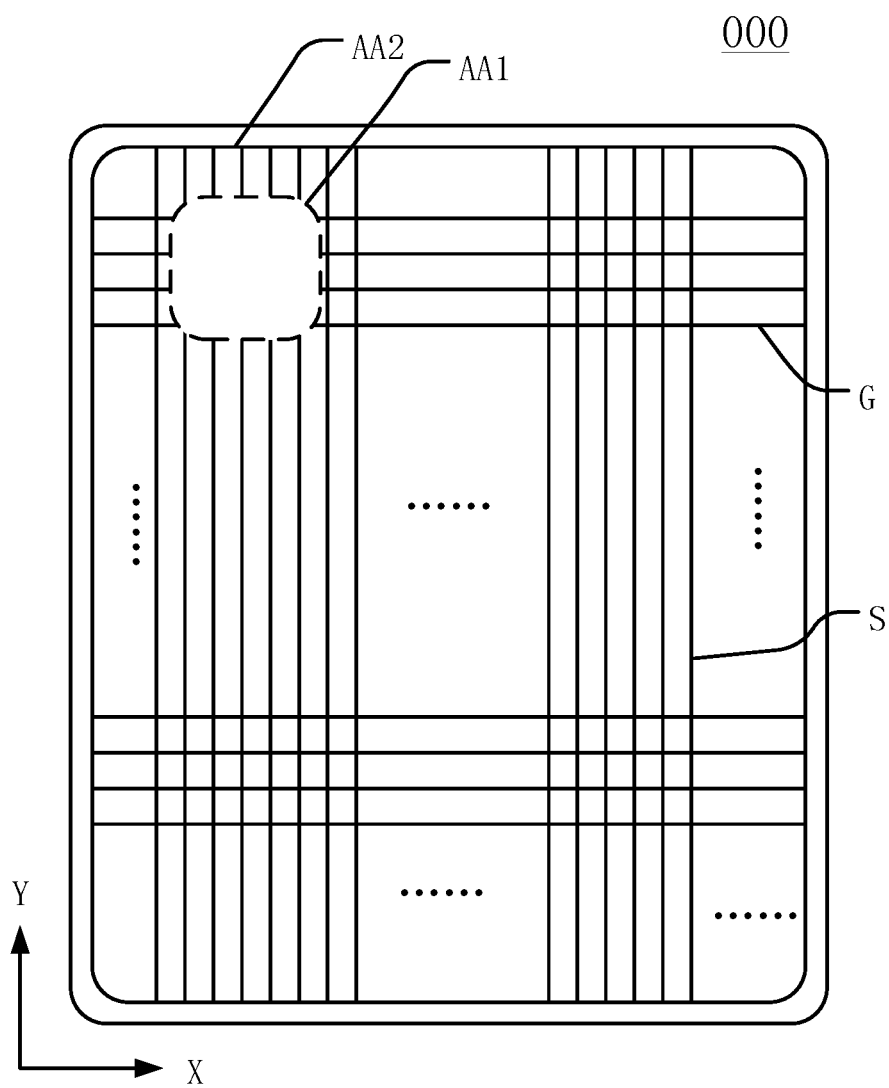
FIG. 1 illustrates a planar structural schematic of a display panel according to various embodiments of the present disclosure.

Various embodiments of the present disclosure are described in detail with reference to the drawings. It should be noted that the relative arrangement of components and steps, numerical expressions, and numerical values set forth in the embodiments may not limit the scope of the present disclosure unless specifically stated otherwise.

The following description of at least one exemplary embodiment is merely illustrative, which may not limit the present disclosure and its application or use.

Techniques, methods and equipment known to those skilled in the art may not be discussed in detail, but where appropriate, the techniques, methods and equipment should be considered as a part of the specification.

In all exemplary embodiments shown and discussed herein, any specific values should be interpreted as merely exemplary and not limiting. Therefore, other examples of the exemplary embodiments may have different values.

It should be noted that similar reference numerals and letters indicate similar items in the following drawings. Therefore, once an item is defined in one drawing, there is no need to discuss it further in subsequent drawings.

In the existing technology, an under-screen camera approach may be designed to increase the screen-to-body ratio and actually achieve the full screen. The so-called under-screen camera approach may refer to disposing a certain photosensitive element (e.g., a front camera) in a display device to be under the screen. When the photosensitive element is not in operation, the display device may display pictures at the position of the photosensitive element; and when the photosensitive element is in operation, the display device may be in a transparent state at the position of the photosensitive element, and the photosensitive element may receive external light passing through the display device to achieve a configured function (e.g., photographing function). Meanwhile, in order to prevent the scattering of certain metal structures (e.g., scan lines, data lines, and the like) at the position of the photosensitive element from affecting the photographing effect of the camera, transparent metal wires may be used at the position of the photosensitive element to improve the photographing effect of the camera. However, the impedance of the transparent metal material is relatively large, and the display signal transmission delay is relatively large when the pictures are displayed at the position of the photosensitive element, which may result in insufficient charging of the display pixels and easily affect the display effect at the position of the photosensitive element.

A display panel and a display device are provided in the present application, which may increase the screen-to-body ratio and achieve an improved full screen display effect without affecting the use effect of the photosensitive element (e.g., a camera) and the display effect of the display panel. The embodiments of the display panel and the display device provided in the present application are described in detail hereinafter.

Figure 2:
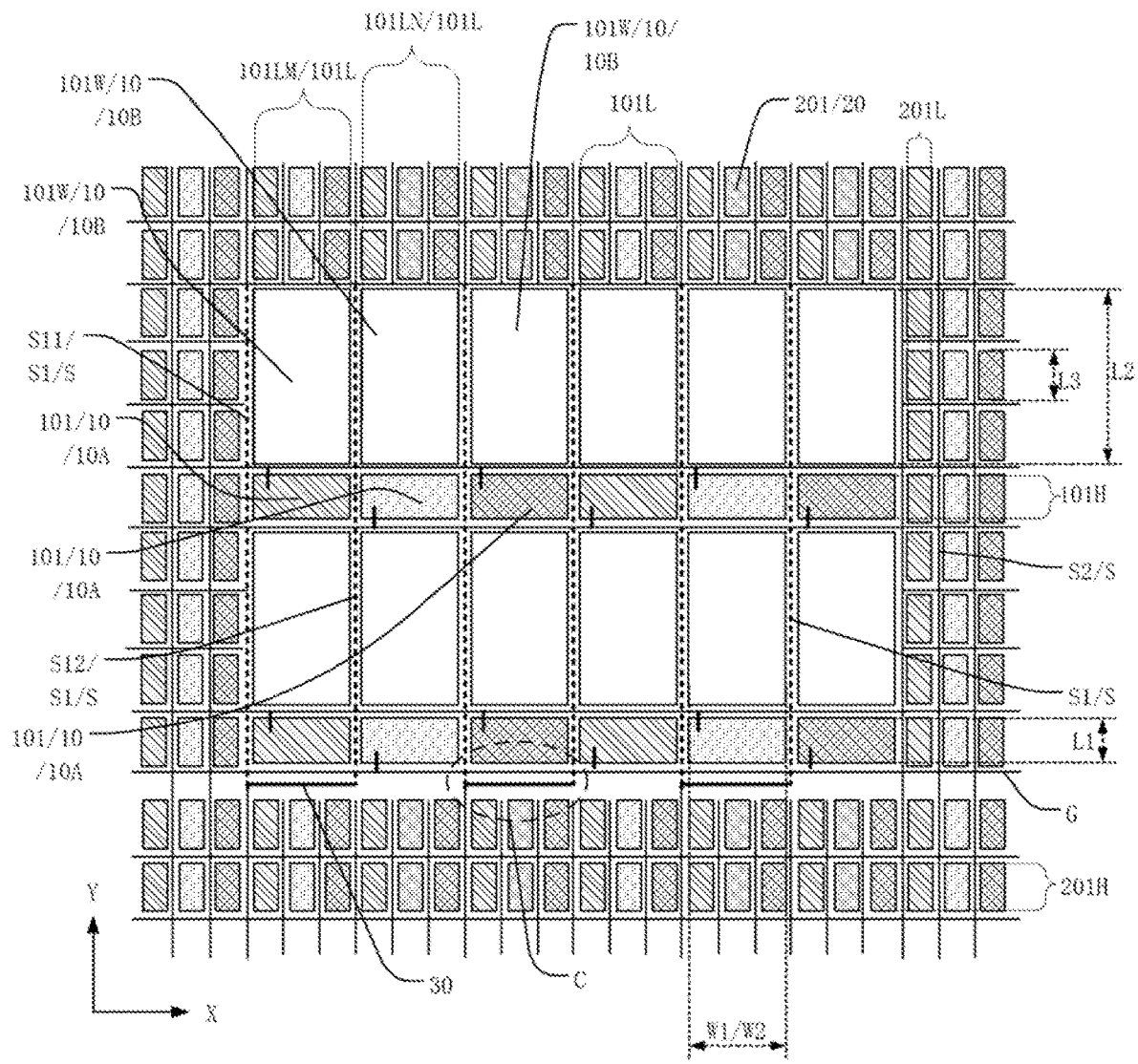
FIG. 2 illustrates a local enlarged structural schematic of a first display region and its surrounding region in FIG. 1.

Referring to FIGS. 1-2, FIG. 1 illustrates a planar structural schematic of a display panel according to various embodiments of the present disclosure; and FIG. 2 illustrates a local enlarged structural schematic of a first display region and its surrounding region in FIG. 1. A display panel 000, provided in one embodiment, may include a first display region AA1 and a second display region AA2 which are adjacently arranged. The light transmittance of the first display region AA1 may be greater than the light transmittance of the second display region AA2.

The first display region AA1 may include a plurality of first pixels 10 arranged in an array. The first pixel 10 may include a first region 10A and a second region 10B; and the first region 10A may include a plurality of first sub-pixels 101 with different colors (three first sub-pixels 101 with different colors in the first region 10A are distinguished by different filling patterns in FIG. 2). The light transmittance of the second region 10B may be greater than the light transmittance of the first region 10A.

A plurality of first sub-pixels 101 arranged along a first direction X may form a first sub-pixel row 101H, and a plurality of first sub-pixels 101 arranged along a second direction Y may form a first sub-pixel column 101L, where the first direction X intersects the second direction Y. Optionally, the first direction X and the second direction Y may be perpendicular to each other along a plane in parallel with a light-exiting surface of the display panel 000.

The display panel 000 may include a plurality of scan lines G extending along the first direction X and a plurality of data lines S extending along the second direction Y, and one first sub-pixel row 101H may be electrically connected to at least two scan lines G.

The data lines S may include first data line S1; one first data line S1 may be electrically connected to the first sub-pixel column 101L; and at least a part of the first data lines S1 may be made of a transparent conductive material (all of the first data lines S1 using the transparent conductive material may be taken as an example for illustration in FIG. 2).

Optionally, the remaining signal lines on the display panel 000 may all be made of a non-transparent conductive material, or the remaining signal lines on the display panel 000 may also be made of a transparent conductive material, or the remaining signal lines on the display panel 000 may be partly made of a transparent conductive material and partly made of a non-transparent conductive material, which may not be limited according to various embodiments of the present disclosure. In FIGS. 1-2, at least a part of the first data lines S1 may be made of the transparent conductive material, and the remaining signal lines (including the scan lines G and data lines S) may be made of the non-transparent conductive material as an example for illustration; and the dotted line may be used to distinguish between the transparent conductive material and the non-transparent conductive material. Optionally, the transparent conductive material may include indium tin oxide (ITO) or other suitable material with high transmittance and conductivity, which may not be limited according to various embodiments of the present disclosure.

In the first display region AA1, at least two first data lines S1 may be connected through a connection line 30.

It may be understood that, in order to clearly illustrate the technical solution of one embodiment, FIG. 2 only exemplarily illustrates the connection relationship between the scan lines G, the first data lines S1, and the first sub-pixels 101. In an implementation manner, the first sub-pixel 101 may include a thin-film transistor and a pixel electrode. The gate of the thin-film transistor may be connected to the scan line G, the source of the thin-film transistor may be connected to the first data line S1, and the drain of the thin-film transistor may be connected to the pixel electrode, which may not be illustrated in one embodiment and may be understood with reference to the connection structure of sub-pixels in the existing technology.

For example, the display panel 000 provided in one embodiment may include the first display region AA1 and the second display region AA2 that are adjacently disposed. The light transmittance of the first display region AA1 may be greater than the light transmittance of the second display region AA2, the display panel 000 may be disposed with the photosensitive element such as the under-screen camera within the range of the first display region AA1, and the second display region AA2 may be a normal display region. Optionally, the PPI (pixels per inch which is the pixel density indicating the number of pixels per inch of the display panel) in the first display region AA1 may be configured to be less than the PPI in the second display region AA2, and the first display region AA1 may be configured with a light-transmitting region, such that it may implement that the light transmittance of the first display region AA1 is greater than the light transmittance of the second display region AA2 (as shown in FIGS. 1-2). That is, the first display region AA1 may include the plurality of first pixels 10 arranged in an array, and the first pixel 10 may include the first region 10A and the second region 10B. The first region 10A may include the plurality of first sub-pixels 101 with different colors. The PPI of the plurality of first sub-pixels 101 with different colors disposed in the first region 10A may be less than the PPI of the sub-pixels (not labeled in FIGS. 1-2) in the range of the second display region AA2. The light transmittance of the second region 10B may be greater than the light transmittance of the first region 10A, the second region 10B may be a high light-transmitting region, and white sub-pixels may be disposed in the second region 10B. The second region 10B may also not be disposed with any sub-pixel structures, such that the light transmittance of the second region 10B may be greater than the light transmittance of the first region 10A. Optionally, the PPI in the first display region AA1 may also be configured to be equal to the PPI in the second display region AA2. However, the first display region AA1 may have the light-transmitting region which is not arranged in the second display region AA2, thereby realizing that the light transmittance of the first display region AA1 is greater than the light transmittance of the second display region AA2 (not shown in FIGS. 1-2), which may not be limited according to various embodiments of the present disclosure.

Since the light transmittance of the first display region AA1 is greater than the light transmittance of the second display region AA2, the first display region AA1 may implement the display function and also be multiplexed as a photosensitive element disposing region. That is, the photosensitive element such as the under-screen camera may be disposed in the range of the first display region AA1 of the display panel 000. The second display region AA2 is a normal display region. When the photosensitive element is not in operation, the first display region AA1 and the second display region AA2 may jointly display pictures to achieve the full screen display effect. When the photosensitive element is in operation, the light transmittance of the second region 10B of the first pixel 10 may be greater than the light transmittance of the first region 10A, such that the first display region AA1 may have high light transmittance, and the photosensitive element such as the under-screen camera disposed in the first display region AA1 may receive the external light passing through the first display region AA1 to implement a configured function (e.g., photographing function), thereby implementing the display function of the first display region AA1 and further implementing high transmittance for providing the condition for the photosensitive element's operation.

In one embodiment, in the range of the first display region AA1, the plurality of first sub-pixels 101 arranged along the first direction X may form the first sub-pixel row 101H, and the plurality of first sub-pixels 101 arranged along the second direction Y may form the first sub-pixel column 101L, where the first direction X and the second direction Y may be perpendicular to each other on the plane in parallel with the light-exiting surface of the display panel 000. The display panel 000 may include the plurality of scan lines G extending along the first direction and the plurality of data lines S extending along the second direction Y; and the scan lines G and the data lines S may be configured to be insulated and crossed to define the regions where the display sub-pixels are located. The data lines in the range of the first display region AA1 may be the first data lines S1, and one first data line S1 may be electrically connected to the first sub-pixel column 101L. The scan lines G and the data lines S may be configured to provide display drive signals for the display panel to implement the display function. In one embodiment, the material of at least a part of the first data lines S1 in the first display region AA1 may be configured to be the transparent conductive material, which may prevent the metal scattering of the metal signal lines in the first display region AA1 from affecting the function of the photosensitive element as possible, such as the photographing effect of the camera, thereby being beneficial for improving the use effect of the photosensitive element, such as the camera and the like, in the first display region AA1. In one embodiment, one first sub-pixel row 101H in the first display region AA1 may be configured to be electrically connected to at least two scan lines G, and at least two first data lines S1 may be configured to be connected through the connection line 30. That is, the structure of the first display region AA1 may be designed as a double gate line structure where two first data lines S1 may be connected with each other through the connection line 30, thereby implementing the display function of the first display region AA1. Compared with the existing technology that one data signal is only transmitted to one first data line S1, in one embodiment, one data signal may be transmitted to at least two first data lines S1 connected through the connection line 30, and the signal impedance on each first data line S1 may be distributed, which may reduce the signal impedance on each first data line S1 and the transmission impedance of the data signal, thereby being beneficial for improving the signal delay and avoiding insufficient charging of the sub-pixels in the first display region AA1, and further being beneficial for improving the display effect of the first display region AA1.

It should be noted that the display panel provided in one embodiment may be a liquid crystal display panel, and a light source may be provided through a backlight module (not shown FIGS. 1-2). The liquid crystal display panel may include a color filter (CF) substrate, a thin-film transistor (TFT) array substrate, and a liquid crystal layer between the CF substrate and the TFT substrate. The working principle of the liquid crystal display may be the following. The rotation of liquid crystal molecules in the liquid crystal layer may be controlled by applying a drive voltage, the light from the light source provided by the backlight module may pass through the TFT substrate of the liquid crystal display panel and may be refracted from the liquid crystal layer of the liquid crystal display panel and generate color pictures through the CF substrate. The second region 10B of the first pixel 10 in the first display region AA1 in one embodiment may be a region without disposing the color filter.

It should be further noted that the display panel provided in one embodiment may also be an organic light-emitting display panel, and the backlight module for providing backlight may not be needed. The organic light-emitting display panel, being lighter and thinner, may emit light independently and have a larger viewing-angle and a significant energy-saving effect. The displaying principle of the organic light-emitting display panel may be the following. A transparent electrode and a metal electrode may be respectively used as an anode and a cathode of a device; driven by a certain electric field, electrons and holes may be respectively injected from the cathode and the anode to electron and hole transport layers; electrons and holes may migrate to a light-emitting layer through the electron and hole transport layers respectively, and meet in the light-emitting layer to form excitons and excite light-emitting molecules; when a suitable power voltage is supplied, the positive holes and the negative charges may be combined in the light-emitting layer to generate light; and according to different formulas, three primary colors of red, green and blue may be generated to form basic colors. The second region 10B of the first pixel 10 in the first display region AA1 in one embodiment may be a region without disposing a color light-emitting material.

Figure 3:
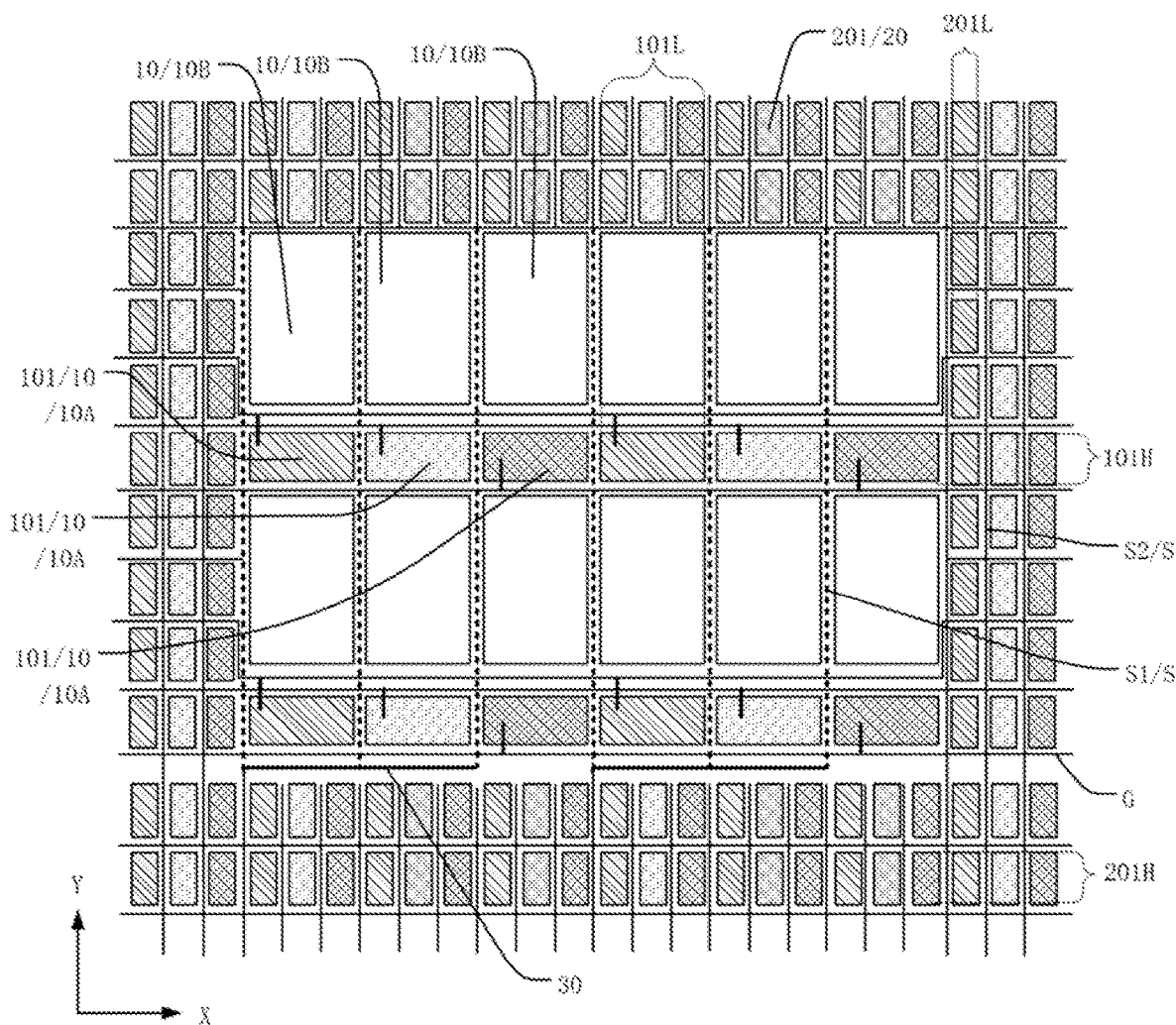
FIG. 3 illustrates another local enlarged structural schematic of a first display region and its surrounding region in FIG. 1.

It can be understood that, in one embodiment, the first sub-pixel row 101H may be electrically connected to two scan lines G, and two first data lines S1 may be connected to each other through the connection line 30 in FIGS. 1-2. During an implementation manner, one first sub-pixel row 101H may also be electrically connected to three scan lines G, and the three first data lines S1 may be connected to each other through the connection line 30 (as shown in FIGS. 1 and 3, FIG. 3 illustrates another local enlarged structural schematic of the first display region and its surrounding region in FIG. 1), which may be selected and configured according to actual needs during an implementation.

It can be understood that, in one embodiment, FIG. 1 only exemplarily illustrate the shape of the first display region AA1. In an implementation manner, the shape of the first display region AA1 may be configured to be a regular shape, such as a right-angled rectangle, a rounded rectangle, a circle, an ellipse, or the like. The shape of the first display region AA1 may also be configured to be an irregular shape, for example, the shape of the first display region AA1 may be configured to be a water drop shape, or the like. In practical applications, the shape of the first display region AA1 may be designed according to the shape of the photosensitive element disposed in the first display region AA1, which may not be limited according to various embodiments of the present disclosure.

It should be understood that, in one embodiment, FIG. 1 may only exemplarily illustrate the relative positional relationship between the first display region AA1 and the second display region AA2, which may not be limited herein. The relative positional relationship and shape of the first display region AA1 and the second display region AA2 may not be limited according to various embodiments of the present disclosure, which may be configured according to the screen design of the display panel 000. For example, the second display region AA2 may be disposed surrounding the first display region AA1 (as shown in FIG. 1), and the first display region AA1 may also be disposed in a corner or an edge position of the second display region AA2, which may not be limited according to various embodiments of the present disclosure.

Figure 4:
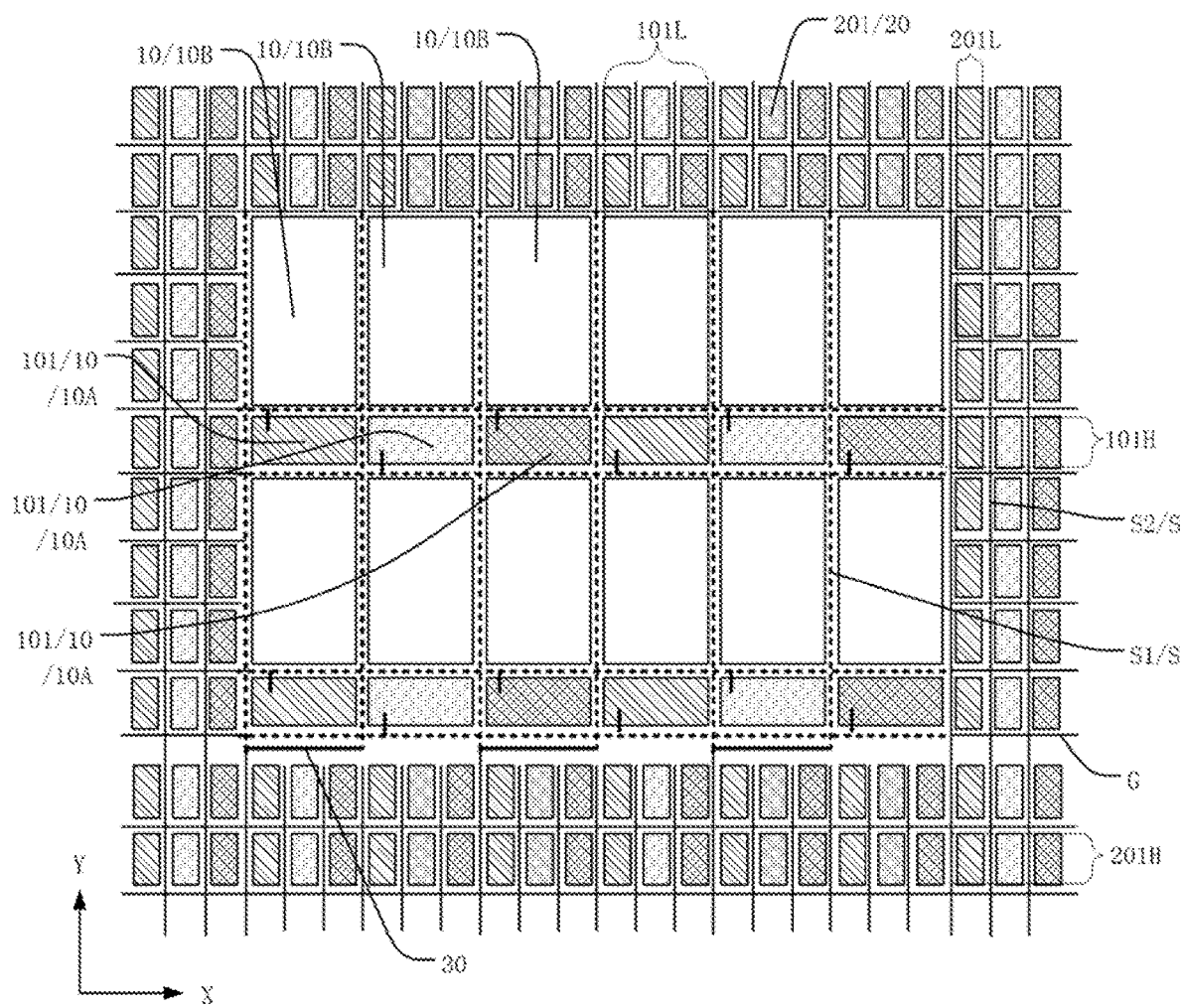
FIG. 4 illustrates another local enlarged structural schematic of a first display region and its surrounding region in FIG. 1.

In some optional embodiments, FIG. 4 illustrates another local enlarged structural schematic of the first display region and its surrounding region in FIG. 1. In order to further increase the transmittance of the first display region AA1, the signal lines in the first display region AA1, including the scan lines G and the first data lines S1 in the first display region AA1, may be made of the transparent conductive material, which may meet the high transmittance requirement of the first display region AA1, and further avoid the influence of metal scattering on the photographing effect.

In some alternative embodiments, referring to FIGS. 1-4, in one embodiment, the second display region AA2 may include a plurality of second pixels 20 arranged in an array, and the second pixels 20 may include a plurality of second sub-pixels 201 with different colors; a plurality of second sub-pixels 201 arranged along the first direction X may form a second sub-pixel row 201H, a plurality of second sub-pixels 201 arranged along the second direction Y may form a second sub-pixel column 201L, and one second sub-pixel row 201H may be electrically connected to a scan line G; the data lines S may further include second data lines S2, ang one second data line S2 may be electrically connected to the second sub-pixel column 201L; and at least two first data lines S1 connected through the connection line 30 may be connected to one second data line S2. It may be understood that, in order to clearly illustrate the technical solution in one embodiment, the connection relationship between the scan lines G, the second data lines S2, and the second sub-pixels 201 may not be illustrated in FIGS. 2-4. In an implementation manner, the second sub-pixel 201 may include a thin-film transistor and a pixel electrode; the gate of the thin-film transistor may be connected to the scan line G, the source of the thin-film transistor may be connected to the second data line S2, and the drain of the thin-film transistor may be connected to the pixel electrode, which may not be illustrated in one embodiment and may refer to the connection structure of sub-pixels in the existing technology.

In one embodiment, it may further describe that the second display region AA2 is configured as the normal display region. The second display region AA2 may include the plurality of second pixels 20 arranged in an array; the second pixel 20 may include the plurality of second sub-pixels 201 with different colors; and the plurality of second sub-pixels 201 arranged along the first direction X may form the second sub-pixel row 201H, and the plurality of second sub-pixels 201 arranged along the second direction Y may form the second sub-pixel column 201L. One second sub-pixel row 201H may be electrically connected to one scan line G, one second data line S2 may be electrically connected to the second sub-pixel column 201L, and the second data line S2 may be the data line S in the second display region AA2. Since at least a part of the first data lines S1 in the first display region AA1 is made of the transparent conductive material, the second data line S2 in the second display region AA2 may be configured as a non-transparent conductive material, such as a metal conductive material, such that the second display region AA2 may not have signal transmission delay due to the large impedance of the transparent conductive material in the first display region AA1. Therefore, at least two first data lines S1 in the first display region AA1 connected through the connection line 30 may be connected to one second data line S2 in the second display region AA2, which may implement the display function and also avoid that the signal line in the second display region AA2 is configured as the transparent conductive material which affects the signal transmission efficiency.

In some alternative embodiments, referring to FIGS. 1-2, at least two first data lines S1 connected through the connection line 30 may include a first sub-data line S11 and a second sub-data line S12. The first sub-pixel column 101L electrically connected to the first sub-data line S11 may be an M-th sub-pixel column 101LM, and the first sub-pixel column 101L electrically connected to the second sub-data line S12 may be an N-th sub-pixel column 101LN.

In a same first sub-pixel row 101H, the first sub-pixel of the M-th sub-pixel column 101LM and the first sub-pixel of the N-th sub-pixel column 101LN may be connected to different scan lines G.

In one embodiment, it may further describe that, in order to cooperate with the two first data lines S1 being connected with each other through the connection line 30 which may reduce the data signal transmission impedance, improve the signal delay and avoid insufficient charging of the sub-pixels in the first display region AA1, the structure of the first display region AA1 may need to be designed as a double gate line structure. At least two first data lines S1 connected through the connection line 30 in the first display region AA1 may be configured to include the first sub-data line S11 and the second sub-data line S12. The first sub-pixel column 101L electrically connected to the first sub-data line S11 may be the M-th sub-pixel column 101LM, and the first sub-pixel column 101L electrically connected to the second sub-data line S12 may be the N-th sub-pixel column 101LN. In a same first sub-pixel row 101H, the first sub-pixel of the M-th sub-pixel column 101LM and the first sub-pixel of the N-th sub-pixel column 101LN may be connected to different scan lines G. When a data signal is simultaneously provided to the first sub-data line S11 and the second sub-data line S12 in the first display region AA1 through a same second data line S2 in the range of the second display region AA2, whether different first sub-pixels of the M-th sub-pixel columns 101LM and N-th sub-pixel columns 101LN are turned on for conduction may be controlled through different scan lines G, thereby implementing the display function of the first display region AA1.

In some alternative embodiments, referring to FIGS. 1-4, the material of the connection line 30 connecting at least two first data lines S1 with each other may be configured to be same as the material of the second data line S2 in the display panel 000 (solid lines may be used to illustrate the connection line 30 and the second data line S2, indicating that the materials of the connection line 30 and the second data line S2 are same).

In one embodiment, it may further describe that since the second display region AA2 is used as the normal display region, the second sub-pixel row 201H of the second display region AA2 may be electrically connected to one scan line G, and one second data line S2 may be electrically connected to the second sub-pixel column 201L; moreover, the material of at least the second data line S2 in the second display region AA2 may be a non-transparent conductive material, such as a metal conductive material, and at least two first data lines S1 connected through the connection line 30 may be ultimately connected to one second data line S2 to provide the data signal to two first data lines S1 through one second data line S2. Therefore, the materials of the connection line 30 and the second data line S2 may be same, which may both be non-transparent conductive materials, thereby reducing the number for switching the wirings and reducing wiring complexity.

In some alternative embodiments, referring to FIGS. 1-4, in the display panel 000 of one embodiment, the materials of the first data lines S1 in the first display region AA1 may all be transparent conductive materials.

In one embodiment, it may further describe that the materials of the first data lines S1 in the first display region AA1 may all be configured as transparent conductive materials. In such way, when the first display region AA1 is used as the photosensitive element disposing region, the transmittance of the first display region AA1 may be further improved, and the metal material scattering may be further improved, thereby further improving the use effect of the photosensitive element disposed in the first display region AA1, for example, the photographing effect when the photosensitive element is a camera.

In some alternative embodiments, referring to FIGS. 1, 2 and 4, FIG. 5 illustrates a local enlarged schematic of a region C in FIG. 2. In one embodiment, at least two first data lines S1, which are connected through the connection line 30, and one second data line S2 may be electrically connected through a first contact via 401.

In one embodiment, it may describe that, in order to improve the transmittance of the first display region AA1, further improve the scattering of the metal material and improve the use effect of the photosensitive element disposed in the first display region AA1, the material of the first data line S1 may be configured as the transparent conductive material. Optionally, the first data line S1 may be be disposed at a same layer as the pixel electrode or a common electrode; and in order to avoid the impedance of the second data line S2 to be excessively large when the second display region AA2 is used as the normal display region, the material of the second data line S2 may be configured as the non-transparent conductive material. Optionally, the second data line S2 may be located on a metal conductive layer of the display panel, and at least one insulation layer may be included between the film layer where the non-transparent conductive material is located and the film layer where the transparent conductive material is located; and the first data line S1 may need to be connected to the second data line S2 to implement data signal transmission. At this point, the first data line S1 and the second data line S2 of different materials and different film layers may be electrically connected through a structure with a contact via, that is, the electrical connection between the first data line S1 and the second data line S2 may be implemented through the first contact via 401, which may satisfy that the material of the first data line S1 in the first display region AA2 is the transparent conductive material and may also ensure the normal transmission of the data signal.

Figure 5:
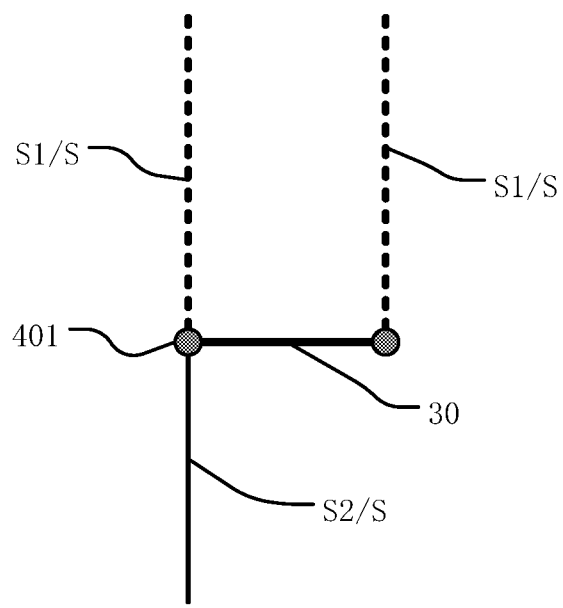
FIG. 5 illustrates a local enlarged schematic of a region C in FIG. 2.

It should be understood that, as shown in FIG. 5, when the material of the connection line 30 is same as the material of the second data line S2, the second data line S2 and the connection line 30 may be fabricated in a same step and with a same process; the connection line 30 and the first data line S1 may be connected through a contact via, which implements that the connection line 30 may connect two first data lines S1 with each other, and two first data lines S1 may be connected to one second data line S2.

Figure 6:
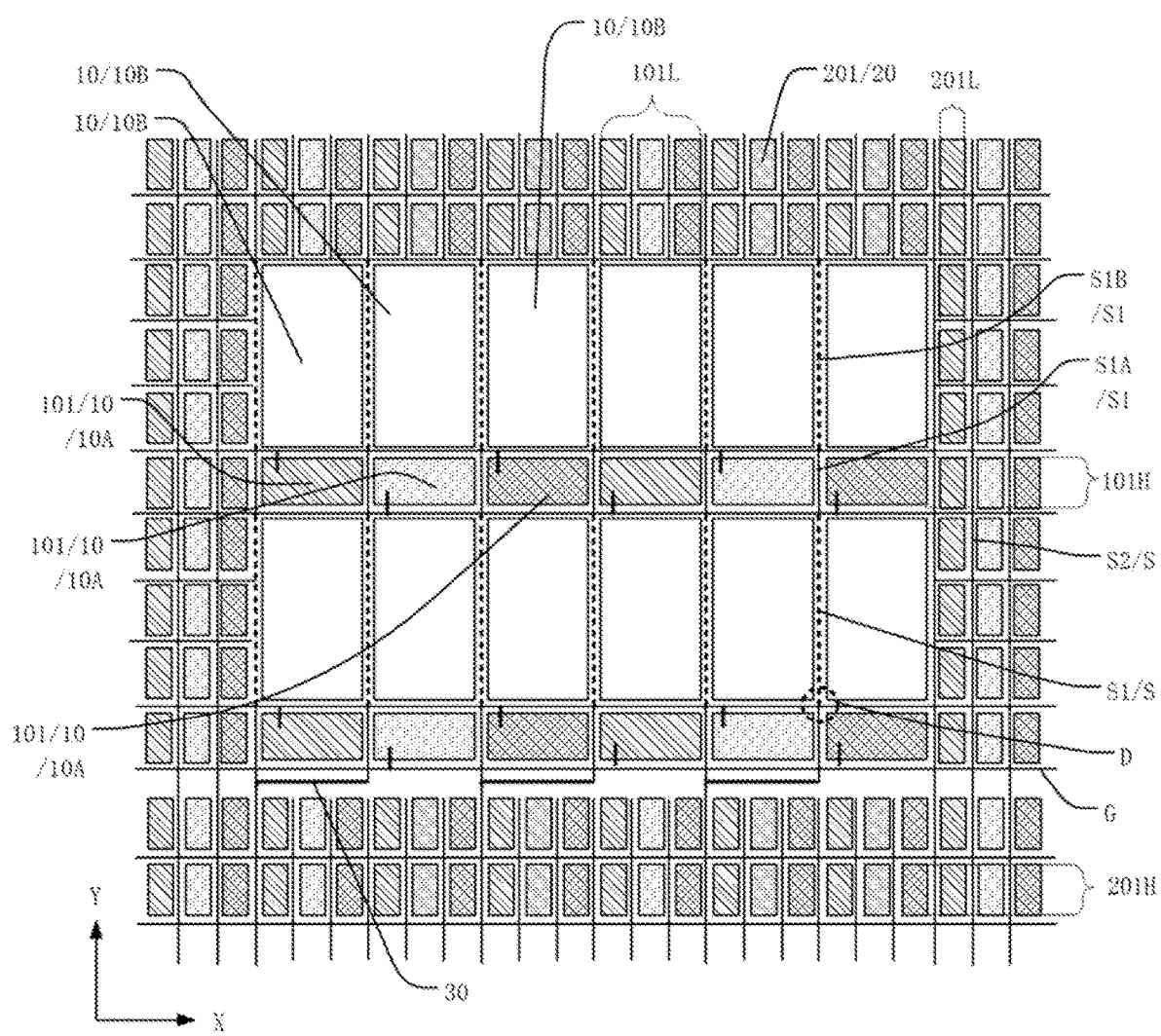
FIG. 6 illustrates another local enlarged structural schematic of a first display region and its surrounding region in FIG. 1.

In some alternative embodiments, refer to FIGS. 1 and 6, FIG. 6 illustrates another local enlarged structural schematic of the first display region and its surrounding region in FIG. 1. In one embodiment, the first data line S1 may include a first sub-portion S1A and a second sub-portion S1B, the first sub-portion S1A may be located in the first region 10A, and the second sub-portion S1B may be located in the second region 10B. The first sub-portion S1A may be made of the non-transparent conductive material, and the second sub-portion S1B may be made of the transparent conductive material.

In one embodiment, it may further describe that all portions of the first data line S1 in the first display region AA1 may not be made of the transparent conductive material. That is, a same first data line S1 may be a two-portion structure, including the first sub-portion S1A and the second sub-portion S1B; and the first sub-portion S1A may be configured as the non-transparent conductive material, and the second sub-portion S1B configured as the transparent conductive material. In one embodiment, in order to ensure the transmittance when the first display region AA1 is used as a photosensitive element disposing region, the material of the second sub-portion S1B of the first data line S1 in the range of the second region 10B with high light transmittance may be configured as the transparent conductive material, and the material of the first sub-portion S1A of the first data line S1 in the range of the first region 10A with low light transmittance may be configured as the non-transparent conductive material. Therefore, the first display region AA1 may be ensured to has sufficient light transmittance for the photosensitive element as possible, and a portion of the same first data line S1 may be made of the non-transparent conductive material and the remaining portion of the same first data line S1 may be made of the transparent conductive material, thereby reducing the overall impedance of the first data line S1, which may be beneficial for reducing the possibility of signal transmission delay and further improving the display effect of the first display region AA1.

Figure 7:
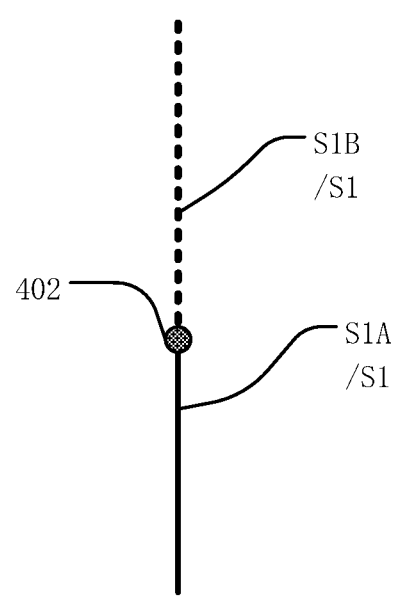
FIG. 7 illustrates a local enlarged schematic of a region D in FIG. 6.

In some alternative embodiments, referring to FIGS. 1, 6, and 7, FIG. 7 illustrates a local enlarged schematic of a region D in FIG. 6. In one embodiment, the first sub-portion S1A and the second sub-portion S1B may be electrically connected through a second contact via 402.

In one embodiment, it may further describe that all portions of the first data line S1 in the first display region AA1 may not be made of the transparent conductive material. That is, a same first data line S1 may be a two-portion structure, including the first sub-portion S1A and the second sub-portion S1B; and the material of the first sub-portion S1A may be configured as the non-transparent conductive material, and the material of the second sub-portion S1B configured as the transparent conductive material. By configuring the material of the second sub-portion S1B of the first data line S1 in the range of the second region 10B with high light transmittance as the transparent conductive material and also configuring the material of the first sub-portion S1A of the first data line S1 in the range of the first region 10A with low light transmittance as the non-transparent conductive material, the first display region AA1 may be ensured to has sufficient light transmittance for the photosensitive element as possible, and a portion of the same first data line S1 may be made of the non-transparent conductive material and the remaining portion of the same first data line S1 may be made of the transparent conductive material, thereby reducing the overall impedance of the first data line S1, which may be beneficial for reducing the possibility of signal transmission delay and further improving the display effect of the first display region AA1. Since a portion of the same first data line S1 is made of the non-transparent conductive material and the remaining portion is made of the transparent conductive material, the first sub-portion S1A made of the non-transparent conductive material and the second sub-portion S1B made of the transparent conductive material may be electrically connected through the second contact via 402.

In some alternative embodiments, referring to FIGS. 1-4 and 6, the connection line 30 connecting at least two first data lines S1may extend along the first direction X in the display panel 000.

In one embodiment, it may describe that the overall extension direction of the first data lines S1 in the first display region AA1 is the second direction Y, and the overall extension direction of the second data lines S2 in the second display region AA2 is also the second direction Y, and the connection line 30 may be used to connect at least two first data lines S1 with each other which are then connected to a same second data line S2. Therefore, the extension direction of the connection line 30 may be configured to be same as the first direction X, and the connection line 30 may be arranged between the sub-pixels in adjacent rows, thereby avoiding that disposing of the connection line 30 may shield the sub-pixel display which affects the display effect of the display panel while implementing reasonable wiring.

In some alternative embodiments, referring to FIGS. 1-4 and 6, in the first display region AA1 of the display panel 000, the area of the first region 10A of the first pixel 10 may be less than or equal to the area of the second region 10B. It should be understood that, in one embodiment, the area of the first region 10A less than the area of the second region 10B may be taken as an example for exemplary illustration in FIGS. 2-4 and 6.

In one embodiment, it may describe that in the first pixel 10, in order to satisfy that the light transmittance of the second region 10B is greater than the light transmittance of the first region 10A, the area of the first region 10A may be configured to be less than or equal to the second region 10B region. While implementing the display function of the first display region AA1, the high light transmittance of the first display region AA1 may be implemented when the first display region AA1 is used as a photosensitive element disposing region, which may provide the condition for the configuration and use of the photosensitive element, and may receive external light passing through the second region 10B of the first pixel 10 as possible to implement the configured function of the photosensitive element (e.g., the photographing function).

In some alternative embodiments, referring to FIGS. 1-2, the second region 10B of the first pixel 10 in the range of the first display region AA1 may include a plurality of white sub-pixels 101W, where the area of the first sub-pixel 101 may be less than or equal to the area of the white sub-pixel 101W. It should be understood that, in one embodiment, the area of the first sub-pixel 101 less than the area of the white sub-pixel 101W may be taken as an example for exemplary illustration in FIGS. 2-4 and 6.

In one embodiment, it may further describe that the plurality of white sub-pixels 101W may be disposed in the second region 10B, the scan lines G and the first data lines S1 may jointly control the turn-on and turn-off of the white sub-pixel 101W, thereby implementing the bright state and the dark state of the white sub-pixel 101W. That is, when the white sub-pixel 101W is turned on, the second region 10B may be transparent, and when the white sub-pixel 101W is turned off, the second region 10B may non-transparent. Furthermore, when the first display region AA1 is used as the photosensitive element disposing region, the light transmittance of the second region 10B when the white sub-pixel 101W is turned on is greater than the light transmittance of the first area 10A, and the light transmittance of the entire first display region AA1 may be increased to provide the condition for the disposing and use of the photosensitive element. For example, when the photosensitive element is a camera, the higher light transmittance of the first display region AA1 may enable the camera to achieve a better photographing effect. Moreover, when the photosensitive element in the first display region AA1 is not in operation (used as the normal display region), the light from the backlight module may pass through more white sub-pixels 101W, and the white sub-pixels 101W may be used to compensate the brightness decrease of the first display region AA1 due to the low PPI, which may avoid the brightness difference between the first display region AA1 and the second display region AA2, thereby being beneficial for improving the full screen display uniformity. Optionally, for the display panel 000 in one embodiment, the plurality of white sub-pixels 101W may be included by configuring the second region 10B of the first pixel 10 in the range of the first display region AA1, where the area of the first sub-pixel 101 may be less than or equal to the area of the white sub-pixel 101W, such that the light transmittance of the second region 10B may be greater than the light transmittance of the first area 10A, which may satisfy the high light transmittance requirement of the first display region AA1; meanwhile, the area of the first sub-pixel 101 in the first display region AA1 may be configured to be less than the area of the second sub-pixel 201 in the second display region AA2, that is, the PPI of the first sub-pixel 101 in the first display region AA1 may be greater than the PPI of the second sub-pixel 201 in the second display region AA2, thereby jointly implementing the objective that the light transmittance of the first display region AA1 is greater than the light transmittance of the second display region AA2.

In some alternative embodiments, referring to FIGS. 1-2, along the first direction X, the length W1 of the first sub-pixel 101 may be equal to the length W2 of the white sub-pixel 101W; and along the second direction Y, the length L1 of the first sub-pixel 101 may be less than the length L2 of the white sub-pixel 101W.

In one embodiment, it may further describe that in the range of the first display region AA1, the length W1 of the first sub-pixel 101 may be configured to be equal to the length W2 of the white sub-pixel 101W along the first direction X, such that the length W1 of each first sub-pixel 101 along the first direction X on a same first sub-pixel column 101L may be equal to the length W2 of the white sub-pixel 101W, which is beneficial for configuring the first data line S1 as a vertical straight line extending along the second direction Y, minimizing the bending of the first data line S1, and further reducing the wiring complexity. In one embodiment, when the length W1 of the first sub-pixel 101 along the first direction X is configured to be equal to the length W2 of the white sub-pixel 101W, the length L1 of the first sub-pixel 101 along the second direction Y may also be configured to be less than the length L2 of the white sub-pixel 101W. In such way, the area of the first sub-pixel 101 is less than the area of the white sub-pixel 101W may be implemented, thereby satisfying that the first display region AA1 has the white sub-pixel 101W with a relatively large area, implementing that the light transmittance of the first display region AA1 is greater than the light transmittance of the second display region AA2, and ensuring the transparency requirement of the first display region AA1 used as the photosensitive element disposing region.

In some alternative embodiments, referring to FIGS. 1-2, along the second direction Y, the sum of the length L2 of the white sub-pixel 101W and the length L1 of the first sub-pixel 101 may be equal to an integral multiple of the length L3 of the second sub-pixel 201.

In one embodiment, it may describe that, along the second direction Y, the sum of the length L2 of the white sub-pixel 101W and the length L1 of the first sub-pixel 101 may be equal to an integral multiple of the length L3 of the second sub-pixel 201. For example, the sum of the length L2 of the white sub-pixel 101W and the length L1 of the first sub-pixel 101 may be equal to four times of the length L3 of the second sub-pixel 201 (shown in FIG. 2); or the sum of the length L2 of the white sub-pixel 101W and the length L1 of the first sub-pixel 101 may be equal to three times of the length L3 of the second sub-pixel 201 (not shown); or the sum of the length L2 of the white sub-pixel 101W and the length L1 of the first sub-pixel 101 may be equal to two times of the length L3 of the second sub-pixel 201 (not shown). In such way, the white sub-pixel 101W, having a relatively large area, of the first display region AA1 may be satisfied, which may satisfy the high light transmittance requirement, and the PPI of the first sub-pixels 101 and the PPI of the white sub-pixels 101W in the first display region AA1 may both be less than the PPI of the second sub-pixels 201 in the second display region AA2, thereby jointly implementing the objective that the light transmittance of the first display region AA1 is greater than the light transmittance of the second display region AA2; and along the second direction Y, the sum of the length L2 of the white sub-pixel 101W and the length L1 of the first sub-pixel 101 may be configured to be equal to an integral multiple of the length L3 of the second sub-pixel 201, such that the scan line G at the position where the first display region AA1 and the second display region AA2 meet may be arranged in a linear structure extending along the first direction X, which may be beneficial for reducing the bending possibility of the scan line G to reduce the wiring difficulty.

Figure 8:
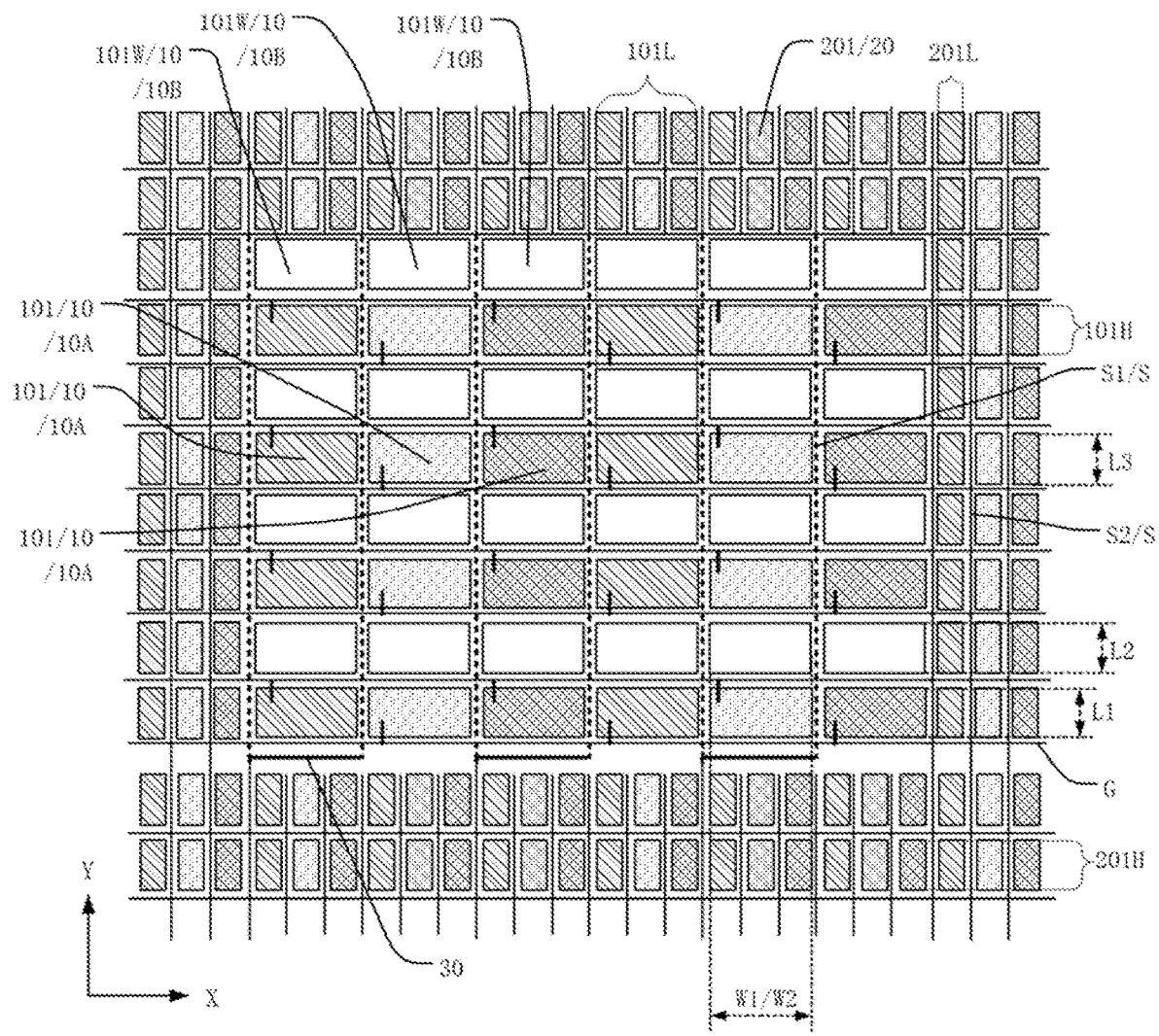
FIG. 8 illustrates another local enlarged structural schematic of a first display region and its surrounding region in FIG. 1.

In some alternative embodiments, referring to FIGS. 1 and 8, FIG. 8 illustrates another local enlarged structural schematic of the first display region and its surrounding region in FIG. 1. In one embodiment, along the second direction Y, the sum of the length L2 of the white sub-pixel 101W and the length L1 of the first sub-pixel 101 may be equal to two times of the length L3 of the second sub-pixel 201.

In one embodiment, it may further describe that the sum of the length L2 of the white sub-pixel 101W and the length L1 of the first sub-pixel 101 may be equal to two times of the length L3 of the second sub-pixel 201 (shown in FIG. 8). In such way, the white sub-pixel 101W, having a relatively large area, of the first display region AA1 may be satisfied, which may satisfy the high light transmittance requirement, and the PPI of the first sub-pixels 101 in the first display region AA1 and the PPI of the white sub-pixels 101W may both be less than the PPI of the second sub-pixels 201 in the second display region AA2, thereby jointly implementing the objective that the light transmittance of the first display region AA1 is greater than the light transmittance of the second display region AA2; and the scan line G at the position where the first display region AA1 and the second display region AA2 meet may be arranged in a linear structure extending along the first direction X, which may be beneficial for reducing the bending possibility of the scan line G to reduce the wiring difficulty. Along the second direction Y, the sum of the length L2 of the white sub-pixel 101W and the length L1 of the first sub-pixel 101 may be configured to be equal to two times of the length L3 of the second sub-pixel 201, such that the first sub-pixel 101 in the first display region AA1 may not be excessively large compared to the second sub-pixel 201 in the second display region AA2 (the normal display region), which may avoid that when the photosensitive element in the first display region AA1 is not in operation (used as the display region), the first sub-pixel 101 with a relatively large size affects the display effect of the first display region AA1.

In some alternative embodiments, referring to FIGS. 1, 2 and 8, along the second direction Y, the length L3 of the second sub-pixel 201 may be equal to the length L1 of the first sub-pixel 101, and the length L2 of the white sub-pixel 101W may be an integral multiple of the length L3 of the second sub-pixel 201.

In one embodiment, it may further describe that the length of each sub-pixel in the display panel 000 along the second direction Y may be configured as follows. Along the second direction Y, the length L3 of the second sub-pixel 201 may be equal to the length L1 of the first sub-pixel 101, and the length L2 of the white sub-pixel 101W may be an integral multiple of the length L3 of the second sub-pixel 201. The length L2 of the white sub-pixel 101W is three times of the length L3 of the second sub-pixel 201 along the second direction Y in FIG. 2 may be taken as an example for exemplary description. The length L2 of the white sub-pixel 101W is two times of the length L3 of the second sub-pixel 201 along the second direction Y (i.e., the length L2 of the white sub-pixel 101W is equal to the length L3 of the second sub-pixel 201) in FIG. 8 may be taken as an example for exemplary description. For the display panel 000 in one embodiment, in order to transmit one data signal to two first data lines S1 connected with each other through the connection line 30 and distribute the signal impedance on each first data line S1 in the first display region AA1 which may reduce the signal impedance on each first data line S1, reduce the data signal transmission impedance, improve the signal delay phenomenon, avoid insufficient charging of the sub-pixels in the first display region AA1 and further improve the display effect of the first display region AA1, the first sub-pixel row 101H in the first display region AA1 may be electrically connected to two scan lines G, and two first data lines S1 may be connected with each other through the connection line 30. That is, the structure of the first display region AA1 may be designed as a double gate line structure. To cooperate with two first data lines S1 being connected with each other through the connection line 30 to implement the display function of the first display region AA1, two scan lines G connected to a same first sub-pixel row 101H may be respectively disposed between adjacent positions of each first sub-pixel row 101H, the length L3 of the second sub-pixel 201 may be equal to the length L1 of the first sub-pixel 101 along the second direction Y, the length L2 of the white sub-pixel 101W may also be an integral multiple of the length L3 of the second sub-pixel 201 along the second direction, such that the scan line G extending from the second display region AA2 may continue to extend along a straight line in the first display region AA1. Optionally, as shown in FIG. 2, the scan line G may extend along a straight line along the first direction X, which is beneficial for reducing the bending possibility of the scan line G and avoid bending and extending of the scan line G at the position adjacent to the first display region AA1 and the second display region AA2 which affects the wiring structure and process efficiency of the display panel.

Figure 9:
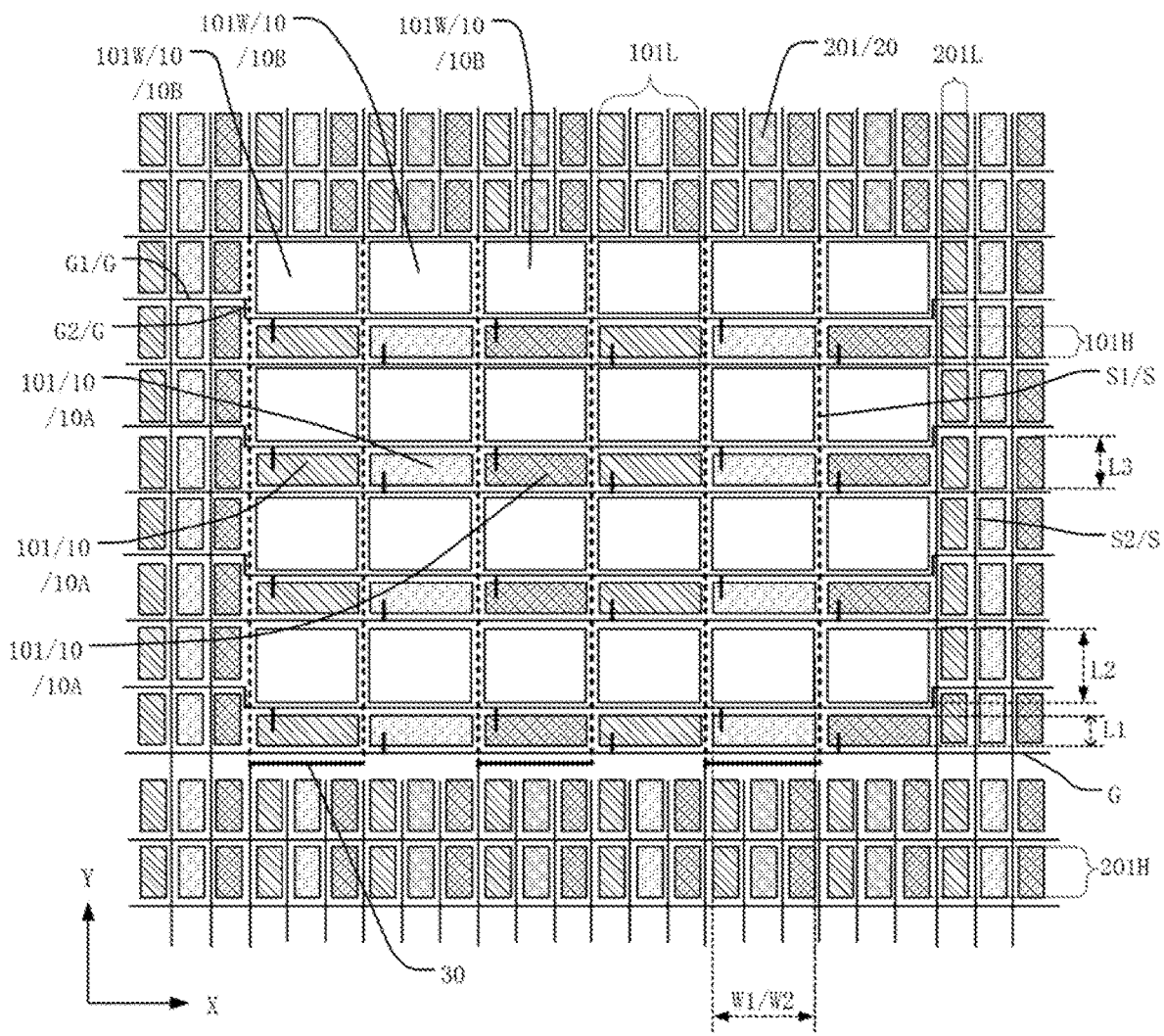
FIG. 9 illustrates another local enlarged structural schematic of a first display region and its surrounding region in FIG. 1.

In some alternative embodiments, referring to FIGS. 1 and 9, FIG. 9 illustrates another local enlarged structural schematic of the first display region and its surrounding region in FIG. 1. In one embodiment, along the second direction Y, the length L1 of the first sub-pixel 101 may be less than the length L3 of the second sub-pixel 201.

In one embodiment, it may describe that the length L1 of the first sub-pixel 101 may be less than the length L3 of the second sub-pixel 201 along the second direction Y. That is, along the second direction Y, the sum of the length L2 of the white sub-pixel 101W and the length L1 of the first sub-pixel 101 may be equal to two times of the length L3 of the second sub-pixel 201. However, the length L1 of the first sub-pixel 101 may be less than the length L3 of the second sub-pixel 201, and the length L2 of the white sub-pixel 101W may be greater than the length L3 of the second sub-pixel 201 (shown in FIG. 9). In such way, the area of the white sub-pixel 101W in the first display region AA1 may be further increased to ensure that the light transmittance of the first display region AA1 is sufficient for the use of the photosensitive element. Furthermore, through the arrangement of the first sub-pixel 101, the normal display function of the first display region AA1 may be implemented when the photosensitive element is not in operation in the first display area AA1.

Optionally, in some optional embodiments, along the second direction Y, the length L1 of the first sub-pixel 101 may be less than the length L3 of the second sub-pixel 201. The scan line G may include a third sub-portion G1 straight-line extending along the first direction X and a fourth sub-portion G2 straight-line extending along the second direction Y, where the third sub-portion G1 and the fourth sub-portion G2 are connected to each other.

In the display panel 000 of one embodiment, the length L1 of the first sub-pixel 101 is less than the length L3 of the second sub-pixel 201 along the second direction Y, that is, along the second direction Y, the length L1 of the first sub-pixel 101 is less than the length L3 of the second sub-pixel 201, and the length L2 of the white sub-pixel 101W is greater than the length L3 of the second sub-pixel 201 (shown in FIG. 9). Therefore, the scan line G extending from the second display area AA2 may need to be bent at the position adjacent to the second display region AA2 and the first display region AA1, such that the scan line G may continue to extend along a straight line between the first sub-pixel rows 101H in the first display region AA1. That is, the scan line G provided in one embodiment may include the third sub-portion G1 straight-line extending along the first direction X and the fourth sub-portion G2 straight-line extending along the second direction Y, where third sub-portion G1 and the fourth sub-portion G2 may be connected to each other; the third sub-portions G1 may be located between the first sub-pixel rows 101H of the first display region AA1 and between the second sub-pixel rows 201H of the second display region AA2, and extend along a straight line along the first direction X; the fourth sub-portion G2, arranged at the position adjacent to the first display region AA1 and the second display region AA2, may be configured to connect the third sub-portions G1, which are not at a same horizontal line, in two different display regions to implement the electrical connection of the entire scan line G, and the fourth sub-portion G2 may extend along a straight line along the second direction Y to avoid oblique wiring of the fourth sub-portion G2 which may increase the difficulty of the overall wiring of the display panel. In one embodiment, it may implement that the area of the white sub-pixel 101W in the first display region AA1 is further increased which may ensure that the light transmittance of the first display region AA1 is sufficient for the use of the photosensitive element, and the structure of the scan line G may also be reasonably arranged, thereby implementing the effect that the first display region AA1 and the second display region AA2 jointly display pictures when the photosensitive element is not in operation.

In some alternative embodiments, referring to FIGS. 1 and 9, the plurality of first sub-pixels 101 with different colors of each first pixel 10 may include a first red sub-pixel 101R, a first green sub-pixel 101G, and a first blue sub-pixel 101B; and the plurality of second sub-pixels 201 with different colors of each second pixel 20 may include a second red sub-pixel 201R, a second green sub-pixel 202G, and a second blue sub-pixel 201B.

In one embodiment, it may describe that the plurality of first sub-pixels 101 with different colors of each first pixel 10 may be the first red sub-pixel 101R, the first green sub-pixel 101G, and the first blue sub-pixel 101B; and the plurality of second sub-pixels 201 with different colors of each second pixel 20 may be the second red sub-pixel 201R, the second green sub-pixel 202G, and the second blue sub-pixel 201B. When the photosensitive element in the first display area AA1 is not in operation, each of the first red sub-pixel 101R, the first green sub-pixel 101G, and the first blue sub-pixel 101B in the first display area AA1 and each of the second red sub-pixel 201R, the second green sub-pixel 202G, and the second blue sub-pixel 201B of the second display region AA2 may jointly enable the second display region AA2 and the first display region AA1 to jointly display pictures, thereby implementing the full screen display effect of display panel 000.

It should be noted that in one embodiment, the strip shapes of the plurality of first sub-pixels 101 with different colors for each first pixel 10 and the plurality of second sub-pixels 201 with different colors for each second pixel 20 may be taken as an example for exemplary illustration. During an implementation manner, the shapes of all sub-pixels may also be other regular or irregular shapes to better implement the display effect and the use effect of the photosensitive element, which may not be described in detail herein.

Figure 10:
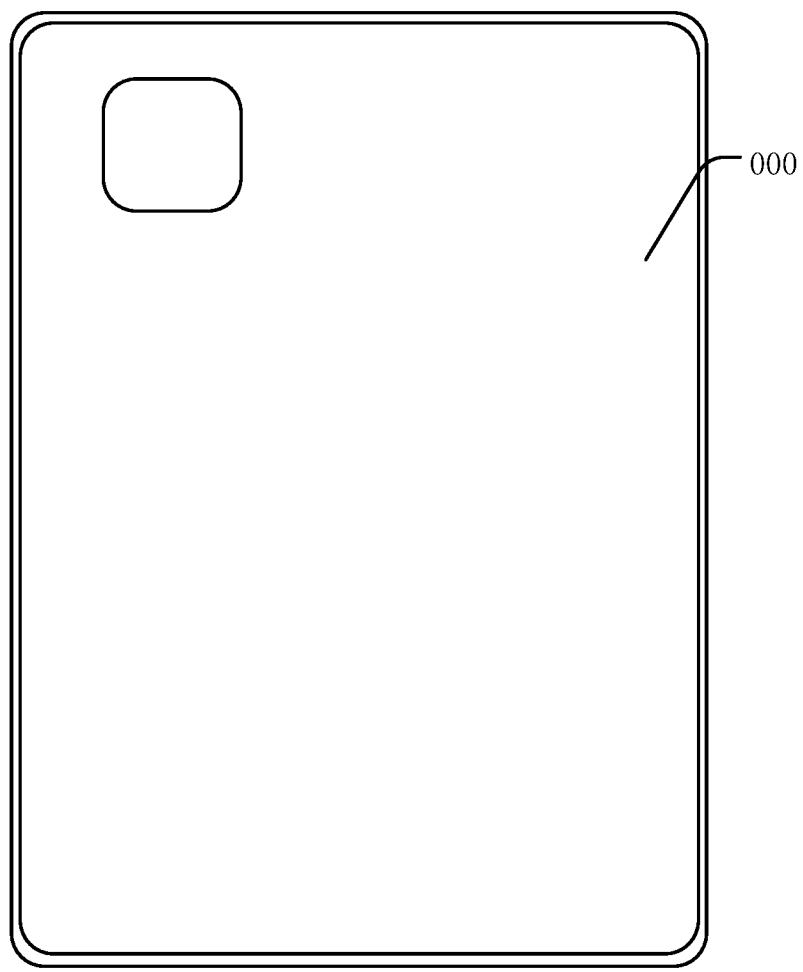
FIG. 10 illustrates a planar structural schematic of a display device according to various embodiments of the present disclosure.

In some alternative embodiments, referring to FIG. 10, FIG. 10 illustrates a planar structural schematic of a display device according to various embodiments of the present disclosure. A display device 111, provided in one embodiment, may include the display panel 000 provided in the above-mentioned embodiments of the present disclosure. A mobile phone may be taken as an example to illustrate the display device 111 in one embodiment. It should be understood that the display device 111 provided in the embodiments of the present disclosure may be a computer, a television, a vehicle-mounted display device, or other display device having a display function, which may not be limited according to various embodiments of the present disclosure. The display device 111 provided by the embodiments of the present disclosure may have the beneficial effects of the display panel 000 provided by the embodiments of the present disclosure, which may refer to the description of the display panel 000 in the above-mentioned embodiments and may not be described in detail herein.

From the above-mentioned embodiments, it can be seen that the display panel and the display device provided by the present disclosure may achieve at least the following beneficial effects.

The display panel provided by the present disclosure may include the first display region and the second region which are adjacently arranged. The light transmittance of the first display region may be greater than the light transmittance of the second display region, and the first display region may implement the display function and may also be multiplexed as the photosensitive element disposing region. The second display region may be the normal display region. When the photosensitive element is not in operation, the first display region and the second display region may jointly display pictures to achieve the full screen display effect. When the photosensitive element is in operation, the light transmittance of the second region of the first pixel may be greater than the light transmittance of the first region, such that the first display region may have high light transmittance, and the photosensitive element such as the under-screen camera disposed in the first display region may receive the external light passing through the first display region to implement the configured function (e.g., the photographing function), thereby implementing high transmittance for the operation of the photosensitive element while implementing the display function of the first display region. In the present disclosure, the material of at least a part of the first data lines in the first display region may be configured to be the transparent conductive material, which may prevent the metal scattering property of the metal signal lines in the first display region from affecting the function of the photosensitive element as possible, such as the photographing effect of the camera, thereby being beneficial for improving the use effect of the photosensitive element, such as the camera, in the first display region. In the present disclosure, one first sub-pixel row in the first display region may also be configured to be electrically connected to at least two scan lines which may be connected through the connection line. That is, the structure of the first display region may be designed as the double gate line structure, and the two first data lines may cooperate to be connected together by the connection line, thereby implementing the display function of the first display region. Compared with the existing technology that one data signal is only transmitted to one first data line, in the present disclosure, one data signal may be transmitted to at least two first data lines connected through the connection line, and the signal impedance on each first data line may be distributed, which may reduce the signal impedance on each first data line and the transmission impedance of the data signal, thereby being beneficial for improving the signal delay and avoiding insufficient charging of the sub-pixels in the first display region, and further being beneficial for improving the display effect of the first display region.

Although certain embodiments of the present disclosure have been described in detail through examples, those skilled in the art should understand that the above-mentioned examples are merely for illustration and not for limiting the scope of the present disclosure. Those skilled in the art should understand that the above-mentioned embodiments may be modified without departing from the scope and spirit of the present disclosure, and the scope of the present disclosure is defined by the appended claims.

What is claimed is:

1. A display panel, comprising:
   a first display region and a second display region which are adjacently arranged, wherein:
   a light transmittance of the first display region is greater than a light transmittance of the second display region;
   the first display region includes a plurality of first pixels arranged in an array; a first pixel of the plurality of first pixels includes a first region and a second region; the first region includes a plurality of first sub-pixels with different colors; and a light transmittance of the second region is greater than a light transmittance of the first region; and
   first sub-pixels arranged along a first direction form a first sub-pixel row, and first sub-pixels arranged along a second direction form a first sub-pixel column, wherein the first direction intersects the second direction; and
   a plurality of scan lines extending along the first direction and a plurality of data lines extending along the second direction, wherein:
   one first sub-pixel row is electrically connected to at least two of the plurality of scan lines;
   the plurality of data lines includes first data lines in the first display region, wherein one of the first data lines is electrically connected to the first sub-pixel column, and at least a part of the first data lines is made of a transparent conductive material; and
   in the first display region, at least two of the first data lines do not overlap with each other and are disposed on two opposite sides of one or more sub-pixel columns along the first direction and connected with each other through a connection line, and the at least two first data lines in the first display region are connected with a same second data line in the second display region, and the connection line is disposed between the first display region and the second display region and extends along the first direction.

2. The display panel according to claim 1, wherein:
   the second display region includes a plurality of second pixels arranged in an array; the plurality of second pixels includes a plurality of second sub-pixels with different colors; second sub-pixels arranged along the first direction form a second sub-pixel row; second sub-pixels arranged along the second direction form a second sub-pixel column; and one second sub-pixel row is electrically connected to one of the plurality of scan lines; and
   the plurality of data lines further includes second data lines, and one of the second data lines is electrically connected to the second sub-pixel column.

3. The display panel according to claim 2, wherein:
   a material of the connection line is same as a material of the second data lines.

4. The display panel according to claim 1, wherein:
   the at least two of the first data lines, which are connected with each other through the connection line, include a first sub-data line and a second sub-data line; the first sub-pixel column electrically connected to the first sub-data line is an M-th sub-pixel column; and the first sub-pixel column electrically connected to the second sub-data line is an N-th sub-pixel column; and
   in a same first sub-pixel row, a first sub-pixel of the M-th sub-pixel column and a first sub-pixel of the N-th sub-pixel column are connected to different scan lines.

5. The display panel according to claim 1, wherein:
   the first data lines are all made of the transparent conductive material.

6. The display panel according to claim 5, wherein:
   the at least two of the first data lines, which are connected with each other through the connection line, are electrically connected with the same second data line through a first contact via.

7. The display panel according to claim 1, wherein:
   a first data line includes a first sub-portion and a second sub-portion, wherein the first sub-portion is in the first region, and the second sub-portion is in the second region; and
   the first sub-portion is made of a non-transparent conductive material, and the second sub-portion is made of the transparent conductive material.

8. The display panel according to claim 7, wherein:
   the first sub-portion is electrically connected to the second sub-portion through a second contact via.

9. The display panel according to claim 1, wherein:
   the connection line is configured, extending along the first direction.

10. The display panel according to claim 1, wherein:
    an area of the first region is less than or equal to an area of the second region.

11. The display panel according to claim 2, wherein:
    the second region includes a plurality of white sub-pixels, wherein an area of a first sub-pixel is less than or equal to an area of a white sub-pixel.

12. The display panel according to claim 11, wherein:
    along the first direction, a length of the first sub-pixel is equal to a length of the white sub-pixel; and along the second direction, a length of the first sub-pixel is less than the length of the white sub-pixel.

13. The display panel according to claim 11, wherein:
    along the second direction, a sum of a length of the white sub-pixel and a length of the first sub-pixel is equal to an integral multiple of a length of a second sub-pixel.

14. The display panel according to claim 13, wherein:
    along the second direction, the sum of the length of the white sub-pixel and the length of the first sub-pixel is equal to two times of the length of the second sub-pixel.

15. The display panel according to claim 13, wherein:
    along the second direction, the length of the second sub-pixel equals to the length of the first sub-pixel, and the length of the white sub-pixel is an integral multiple of the length of the second sub-pixel.

16. The display panel according to claim 15, wherein:
    the scan lines are configured, straight-line extending along the first direction.

17. The display panel according to claim 13, wherein:
    along the second direction, the length of the first sub-pixel is less than the length of the second sub-pixel.

18. The display panel according to claim 17, wherein:
    a scan line of the scan lines includes a third sub-portion straight-line extending along the first direction and a fourth sub-portion straight-line extending along the second direction, wherein the third sub-portion is connected to the fourth sub-portion.

19. The display panel according to claim 2, wherein:
    the plurality of first sub-pixels with different colors of each first pixel includes a first red sub-pixel, a first green sub-pixel, and a first blue sub-pixel; and
    the plurality of second sub-pixels with different colors of each second pixel includes a second red sub-pixel, a second green sub-pixel, and a second blue sub-pixel.

20. A display device, comprising:
a display panel, comprising:
  a first display region and a second display region which are adjacently arranged, wherein:
    a light transmittance of the first display region is greater than a light transmittance of the second display region;
    the first display region includes a plurality of first pixels arranged in an array; a first pixel of the plurality of first pixels includes a first region and a second region; the first region includes a plurality of first sub-pixels with different colors; and a light transmittance of the second region is greater than a light transmittance of the first region; and
    first sub-pixels arranged along a first direction form a first sub-pixel row, and first sub-pixels arranged along a second direction form a first sub-pixel column, wherein the first direction intersects the second direction; and
  a plurality of scan lines extending along the first direction and a plurality of data lines extending along the second direction, wherein:
    one first sub-pixel row is electrically connected to at least two of the plurality of scan lines;
    the plurality of data lines includes first data lines in the first display region, wherein one of the first data lines is electrically connected to the first sub-pixel column, and at least a part of the first data lines is made of a transparent conductive material; and
  in the first display region, at least two of the first data lines do not overlap with each other and are disposed on two opposite sides of one or more sub-pixel columns along the first direction and connected with each other through a connection line, and the at least two first data lines in the first display region are connected with a same second data line in the second display region, and the connection line is disposed between the first display region and the second display region and extends along the first direction.

* * * * *